(12) United States Patent
Li

(10) Patent No.: US 7,126,436 B1
(45) Date of Patent: Oct. 24, 2006

(54) FREQUENCY SYNTHESIZER HAVING A MORE VERSATILE AND EFFICIENT FRACTIONAL-N CONTROL CIRCUIT AND METHOD

(75) Inventor: Shuliang Li, Lynnwood, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/947,519

(22) Filed: Sep. 22, 2004

Related U.S. Application Data

(60) Provisional application No. 60/505,812, filed on Sep. 25, 2003, provisional application No. 60/506,232, filed on Sep. 26, 2003.

(51) Int. Cl.
*H03M 3/00* (2006.01)
(52) U.S. Cl. ...................... 332/127; 341/143
(58) Field of Classification Search ................ 331/1 A, 331/23; 332/128, 127; 341/143
See application file for complete search history.

(56) References Cited

U.S. PATENT DOCUMENTS

| | | | |
|---|---|---|---|
| 4,965,531 A * | 10/1990 | Riley | ............ 331/1 A |
| 5,781,044 A | 7/1998 | Riley et al. | |
| 6,236,703 B1 | 5/2001 | Riley | |
| 6,456,164 B1 | 9/2002 | Fan | |
| 6,509,800 B1 | 1/2003 | Stockton | |
| 6,563,390 B1 | 5/2003 | Kizziar | |
| 6,707,855 B1 | 3/2004 | Patana | |

2004/0022340 A1 * 2/2004 Jaehne et al. ............... 375/376

OTHER PUBLICATIONS

De Muer et al., "1.8 GHz CMOS ΔΣ Fractional-N Synthesizer," EP Solid-State Circuits Conference, 2001, 4 pages.
Ahola et al., "A 2 GHz ΔΣ Fractional-N Frequency Synthesizer in 0.35μm CMOS," EP Solid-State Circuits Conference, 2000, 4 pages.
Lin et al., "A 900-MHz 2.5-mA CMOS Frequency Synthesizer with an Automatic SC Tuning Loop," IEEE Journal of Solid-State Circuits, vol. 36, No. 3, Mar. 2001, pp. 424-431.
Schmitt et al., "Designing an EMC-compliant UHF oscillator," RF Design, Oct. 2000, 8 pages.
Heuberger et al., "Integrated RF transmitter based on SAW Oscillator," EP Solid-State Circuits Conference, 1997, 4 pages.
Texas Instruments, Technical Brief SWRA029, "Fractional/Integer-N PLL Basics," Aug. 1999, pp. 1-54.

* cited by examiner

*Primary Examiner*—Joseph Chang
(74) *Attorney, Agent, or Firm*—Kevin L. Daffer; Daffer McDaniel, LLP

(57) ABSTRACT

A frequency synthesizer is provided having a fractional-N control circuit and method that can selectively apply any fractional ratio to a frequency divider within the feedback loop of a PLL. A special digital delta-sigma modulator can be implemented as the control circuit and can receive any arbitrary numerator and denominator value, or their arithmetic combination, or a positive and negative vector values used by the modulator to achieve an average fractional division. Both the numerator and denominator (or the positive and negative vectors) can be chosen based on any integer value to achieve a more optimal, higher frequency resolution and efficient fractional-N control circuit and methodology thereof.

19 Claims, 6 Drawing Sheets

FREQUENCY SYNTHESIZER HAVING A MORE VERSATILE AND EFFICIENT FRACTIONAL-N CONTROL CIRCUIT AND METHOD

PRIORITY APPLICATION

This application claims priority to Provisional Application No. 60/505,812 entitled "Efficient Generic Algorithm for Fractional-N Modulation in Frequency Synthesizer," filed Sep. 25, 2003; and Provisional Application No. 60/506,232 entitled "Efficient Vector Accumulation Algorithm for Fractional-N Modulation in Frequency Synthesizer," filed Sep. 26, 2003.

BACKGROUND OF THE INVENTION

1. Field of the Invention

The present invention relates to an electronic system and, more particularly, to a frequency synthesizer having a fractional-N control circuit that operates as a modulator to selectively apply any fractional ratio to a multi-modulus frequency divider within, for example, a feedback loop of a phase locked loop (PLL).

2. Description of the Related Art

The following descriptions and examples are not admitted to be prior art or conventional by virtue of their inclusion within this section.

Within nearly every electronic subsystem is some sort of generator that produces cyclical waveforms. The waveform generator is oftentimes referred to as an oscillator. Oscillators are generally rated depending on their stability and accuracy, frequency adjustability (i.e., tunability), and power consumption. A piezoelectric crystal resonator is commonly used to provide a reference frequency that is fixed and generally considered the resonant frequency of the piezoelectric crystal—sometimes referred to as the crystal reference frequency $F_X$. This reference frequency can thereafter be tuned using, for example, a phase-locked loop (PLL). Usually $F_X$ is too high so it is first divided down Q times by a reference frequency divider and becomes the reference frequency $F_R$ for the phase frequency detector (PFD). Thus, $F_R = F_X/Q$. Then the PLL employs a divider within its feedback loop to selectively increase the PFD's reference frequency $F_R$. Thus, the resonator output frequency can be tuned using what will henceforth be referred to as a "frequency synthesizer."

There are numerous ways in which to design a frequency synthesizer using a PLL. For example, the divider within the feedback loop of the PLL can be modified in integer increments. Thus, output from the frequency synthesizer will be in integer-N multiples of the reference frequency $F_R$. In a traditional PLL implementation, the output will be represented as the voltage-controlled oscillator output, and will transition at a frequency of $F_{VCO}$. Thus, $F_{VCO} = N*F_R = N/Q*F_X$. An unfortunate aspect of integer-N frequency dividers is that the selectable discrete frequencies of $F_{VCO}$ is dependent on the value of N. The frequency spacing, oftentimes referred to as the minimum frequency resolution, or minimum channel spacing, using an integer-N divider can, in some instances, be too high for an intended application. Another issue is that for some applications, the integer N must be very large, and results in high phase noise.

Given that frequency synthesizers are used in a wide variety of applications, including FM radios, radar systems, cellular and PCS telephone systems, test equipment such as spectrum analyzers and signal generators, it would be desirable to implement a frequency synthesizer having a smaller minimum channel spacing. In order to achieve a smaller minimum channel spacing, fractional-N dividers are needed. In addition to achieving smaller channel spacing, fractional-N dividers allow small divide values to achieve the same channel spacing, which reduces the phase noise.

A fractional-N divider within the feedback loop can produce a synthesizer output of $F_{VCO} = F_R(N+n/d)$. Thus, in addition to the integer divide factor N, a fractional-N divider will introduce fractions between integers set by a numerator value (n) divided by a denominator value (d). For example, when d=8, n may be an integer from 0 to 7. This example will increase the integer PLL resolution by a factor of 8 by adding 7 divide values between N and N+1. Thus the channel spacing is ⅛ of an integer PLL.

A fractional-N divider usually comprises a fractional-N control logic circuit and an integer-N divider. The divide value of the integer-N divider is switched between two integer values in a manner set by the fractional-N control logic circuit. Thus the average divide value is a fraction number. The way a fractional-N divider works causes signal spurs that are not usually seem on an integer divider, because each time the divide value changes, the PLL makes an abrupt phase correction. To minimize the spurs, the sequence of divide value should be optimized. One approach is delta-sigma modulation. To meet an even higher performance requirement, a compensation circuit could be used to cancel the signal spurs.

One of the desired features of a frequency synthesizer with fractional-N divider is high resolution, or small frequency spacing. The known architecture of a fractional-N divider requires the denominator d to be $2^m$ (where m is an integer), which means 2, 4, 8, 16, 32, 64, 128, 256, 512, 1024, . . . , etc. Many fractional divide values are missing because the steps of the denominator are large. It is desirable to be able to use arbitrary integers for the denominator to further increase the resolution. Furthermore, it is also desirable that the spurious noise generated by the fractional-N divider be as small as possible.

SUMMARY OF THE INVENTION

The problems outlined above are in large part solved by an improved frequency synthesizer circuit, system, and method. The synthesizer preferably implements a fractional-N divider with an improved fractional-N control logic circuit. The circuit employs a new fractional-N pattern generator that functions essentially as a modulator and, preferably, a special delta-sigma modulator. In fact, the implementations can be simpler and more efficient than conventional delta sigma modulators, because the preferred architectures are optimized for the special fractional-N circumstance. Within the digital domain, the modulator utilizes an accumulator that integrates combinations of an arbitrary numerator digital value and an arbitrary denominator digital value. A delta-sigma modulated control pattern is formed as the modulator runs. Because of the delta-sigma modulation feature, the control pattern allows the spurious noise caused by divide value change to be pushed to high frequency, and can be partially suppressed by the PLL loop filter. For some application, spurious signal compensation is not necessary.

According to one example, the fractional-N modulator is clocked by the PLL feedback counter, and produces a delta-sigma modulated output of a logic 1 and logic 0 bitstream. The bitstream represents, for example, the most significant bit of a two's complement signed binary number. The signed binary number can be represented as a remainder number. In order to form the remainder value along with the sign bit logic 1 or logic 0 repeatable pattern, at least one adder is contained within the modulator circuit. If two adders are coupled in series, a first adder can add the numerator value to an error value stored in a register to produce a sum, which is a possible future error in one delta direction. The second adder operates as a subtractor to subtract the denominator value from that sum, and generates the remainder, which is another possible future error of another delta direction. A multiplexer can be used to select either the sum value or the remainder value based on the status of the sign bit of the remainder that represents the delta correct direction. The selected value is forwarded to a register and stored as error value at each circuit clock edge.

According to an alternative embodiment, instead of two adders coupled in series, the pair of adders can be coupled in parallel. The error stored in the register can be fed concurrently into both adders, with the first adder coupled to receive the numerator value and the second adder coupled to receive the numerator value minus the denominator value. The result from the second adder is the same as the configuration having the adders coupled in series. However, instead of the second adder being a subtractor, which essentially adds using two's complement nomenclature, the second adder is a true adder in the alternative embodiment. Using two adders coupled in parallel affords faster throughput of the modulator output.

According to yet another embodiment, instead of using numerator and denominator values, the modulator can receive vector values. These vectors, just like numerator and denominator, also represent the fraction but in another method, and they can be derived from the numerator and the denominator, and vice versa. In addition to the differently defined inputs, the error stored in the register is also differently defined in the new embodiment. Moreover, it uses only one adder, because the error stored in the register indicates the correct delta direction by its sign bit, so only the future error of the correct direction needs to be calculated. As the circuit runs, the sign bit of the error stored in the register forms the fractional-N control pattern.

BRIEF DESCRIPTION OF THE DRAWINGS

Other objects and advantages of the invention will become apparent upon reading the following detailed description and upon reference to the accompanying drawings in which.

Figure 1:
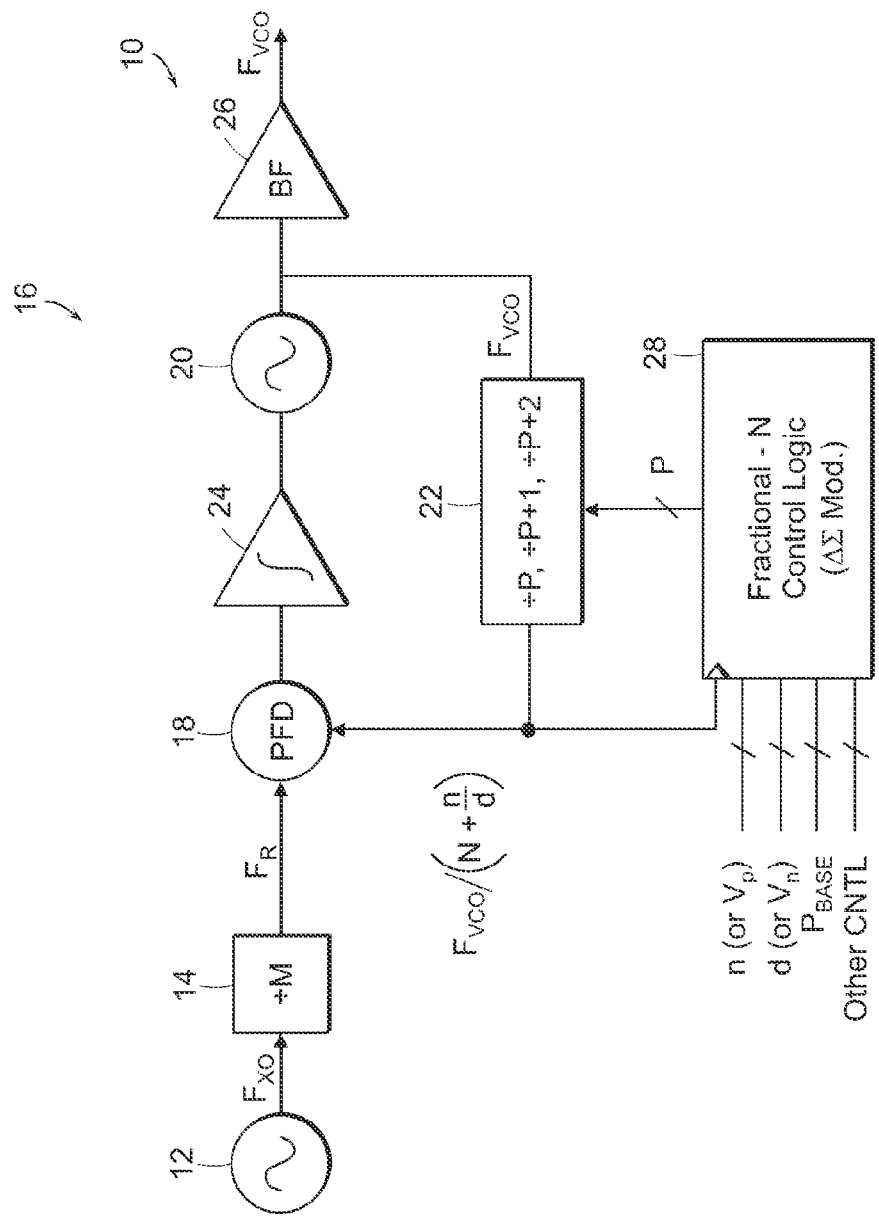
FIG. 1 is a block diagram of a PLL frequency synthesizer with a fractional-N feedback divider that comprises a fractional-N control logic block and an integer-N divider.

While the invention is susceptible to various modifications and alternative forms, specific embodiments hereof are shown by way of example in the drawings and will herein be described in detail. It should be understood, however, that the drawings and detailed description thereto are not intended to limit the invention to the particular form disclosed, but on the contrary, are intended to cover all modifications, equivalents, and alternatives falling within the spirit and scope of the present invention as defined by the appended claims.

DETAILED DESCRIPTION OF PREFERRED EMBODIMENTS

Turning now to the drawings, FIG. 1 is a block diagram of a frequency synthesizer 10 according to one form. Frequency synthesizer 10 contemplates the generation of multiple signal frequencies, all derived from a common reference or time base. The time base may be provided from a crystal oscillator 12. Crystal oscillator 12 includes any form of resonator such as, for example, quartz. The piezoelectric material, such as quartz, produces a piezoelectric effect that can be amplified, wherein the quartz operates as a feedback of low impedance at a particular resonant frequency.

Depending on how the quartz is formed or the crystal is cut, the resonant frequency can change. Typically, however, the resonant frequency is fixed for that particular resonator, with slight modifications to the output frequency available through trimming capacitors and the like. The output from the crystal oscillator thereby produces an alternating voltage or current at the resonant frequency $F_X$ as shown. The output frequency can be divided down using an integer divider 14 at the output of oscillator 12.

Many crystal oscillators can be temperature compensated. It is generally well known that piezoelectric resonators shift slightly in frequency as the operating temperature changes. In order to compensate for the frequency shift, temperature readings can be taken from the resonator and the output from the crystal oscillator may be shifted to offset the temperature skew. The resulting output is, therefore, a temperature-compensated crystal oscillator 12 or TCXO.

A dominant frequency synthesizer used in the wireless communication industry and test equipment (spectrum analyzers and signal generators) employ phase-locked loops (PLLs). Shown in FIG. 1 are four components of PLL 16. Beginning with a phase-frequency detector (PFD) 18, a reference frequency FR is compared with a feedback frequency $F_{VCO}/(N+n/d)$. PFD 18 generates an error signal based on the phase or frequency differences between the reference frequency and the feedback frequency. As shown, the feedback frequency is a divided-down frequency from a voltage-controlled oscillator (VCO) 20. While oscillator 20 produces $F_{VCO}$ proportional to a voltage applied thereon, divider 22 divides $F_{VCO}$ a fractional amount.

PFD 18 can be formed from, for example, a set of D-type flip-flops or, if phase error is all that is required, a set of exclusive OR gates. The phase and/or frequency error output from PFD 18 can then be placed into, for example, a filter such as a low pass filter. In addition to the filter, a charge pump can be used to charge up a voltage based on, for example, the feedback frequency lagging the reference frequency. The combination of low pass filter and charge pump is shown as reference numeral 24.

VCO 20 generates the output signal from frequency synthesizer 10. Depending on the drive requirements, a buffer 26 may be needed. VCO 20 can be achieved using a positive feedback amplifier. As noted above, oscillations occur at the resonant frequency and the oscillations can be tuned via a control voltage that is applied across a varactor, for example, in the tank circuit.

The frequency of the output signal from synthesizer 10 ($F_{VCO}$) can be tuned by changing the feedback divide value P within divider 22. Divider 22 thereby constitutes a main function of the PLL and is needed to cover a very wide range of continuous divisions for the crystal resonator reference and for the VCO. For high frequency VCOs, dual modulus or multi-modulus dividers are employed. In order to minimize noise characteristics of the PFD 18 operation and to lower the minimum channel spacing, fractional-N dividers have gained in popularity. Fractional-N divider can be formed by a programmable integer-N divider 22 (P divider) and a fractional-N control logic circuit 28. The fractional-N control logic circuit is clocked by the P divider, and dynamically supplies the P divider 22 with reload integer value during the locked state. If the supplied values are switched between N and N+1 in the correct proportions, the average divide value P can be N+n/d, which is fractional.

Figure 2:
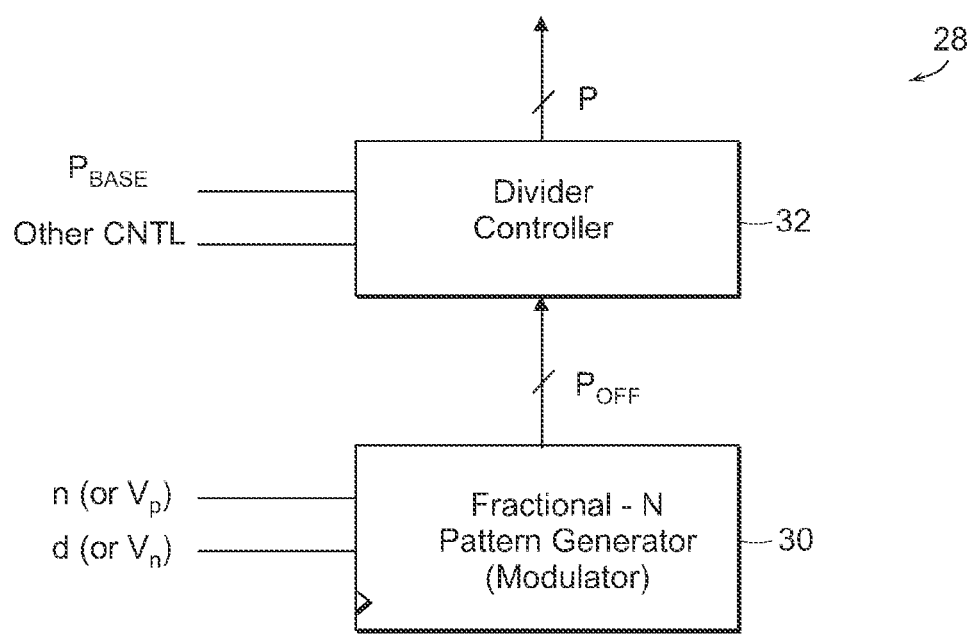
FIG. 2 is a block diagram of a fractional-N control logic block that comprises a fractional-N pattern generator (modulator) and a divider controller.

As shown in FIG. 2, the fractional-N control logic circuit 28 of FIG. 1 comprises a fractional-N pattern generator (modulator) 30 and a divider controller 32. Modulator 30 is clocked by the P divider. Modulator 30 receives fraction information from input ports, in the form of numerator n and denominator d. Alternatively, modulator 30 can receive two vectors $V_p$ and $V_n$, that defines the fraction n/d. It modulates on a control signal $P_{OFF}$, which is often 1-bit wide and indicates whether the integer-N divider should load N or N+1 at each reload operation. At each clock cycle, one bit of the control pattern is presented as $P_{OFF}$. The name $P_{OFF}$ comes from "P divider offset value". However, it may have functions other than the original meaning. $P_{OFF}$ is further processed by a divider controller, which generates an appropriate integer P that is fed into divider 22. For example, $P_{OFF}=0$ indicates N and $P_{OFF}=1$ indicates N+1. If so, the P divide values can be formulated as $P=P_{BASE}+P_{OFF}$, where $P_{BASE}$ is the base value, and $P_{OFF}$ is the offset value. For one example, the divider controller receives $P_{BASE}$ and $P_{OFF}$, and generates the sum P at output. If $P_{BASE}=20$, n=3 and d=8, then the modulator may generate $P_{OFF}$ as 01001001, one bit at each clock, and forming such repeating fractional-N control pattern every d (i.e., 8) cycles. The P value sequence is then 20, 21, 20, 20, 21, 20, 20 and 21, which repeats as the circuit runs. The fractional-N control pattern generated by the modulator has a period of d, and has n 1s in each period. Similar period also applies to P, and its average value is $P=P_{BASE}+n/d$. Hence, the desired fractional divide value is achieved.

The divider controller can have alternative structures and functionalities. In one embodiment, $P=P_{BASE}+P_{STEP}$ (n/d), where $P_{STEP}$ comes from other control inputs. If P=20+1/32, it can be expressed as P=19+2x(33/64), where $P_{STEP}=2$, $P_{BASE}=19$, n=33 and d=64. This makes P switch between 19 and 21 (N and N+2), which is non-consecutive N fractional-N synthesis. If it were synthesized with consecutive N and N+1 (20 and 21), the number of N is just one and the number of N+1 is 31 in one fractional-N modulation cycle. The badly balanced N to N+1 ratio can cause low frequency, high amplitude spurious signal noise at PFD that easily passes through the loop filter to $F_{VCO}$. After using non-consecutive N synthesis, the N and N+2 ratio (33 to 31) is well balanced, and the spurious noise can be reduce in many cases.

Figure 3:
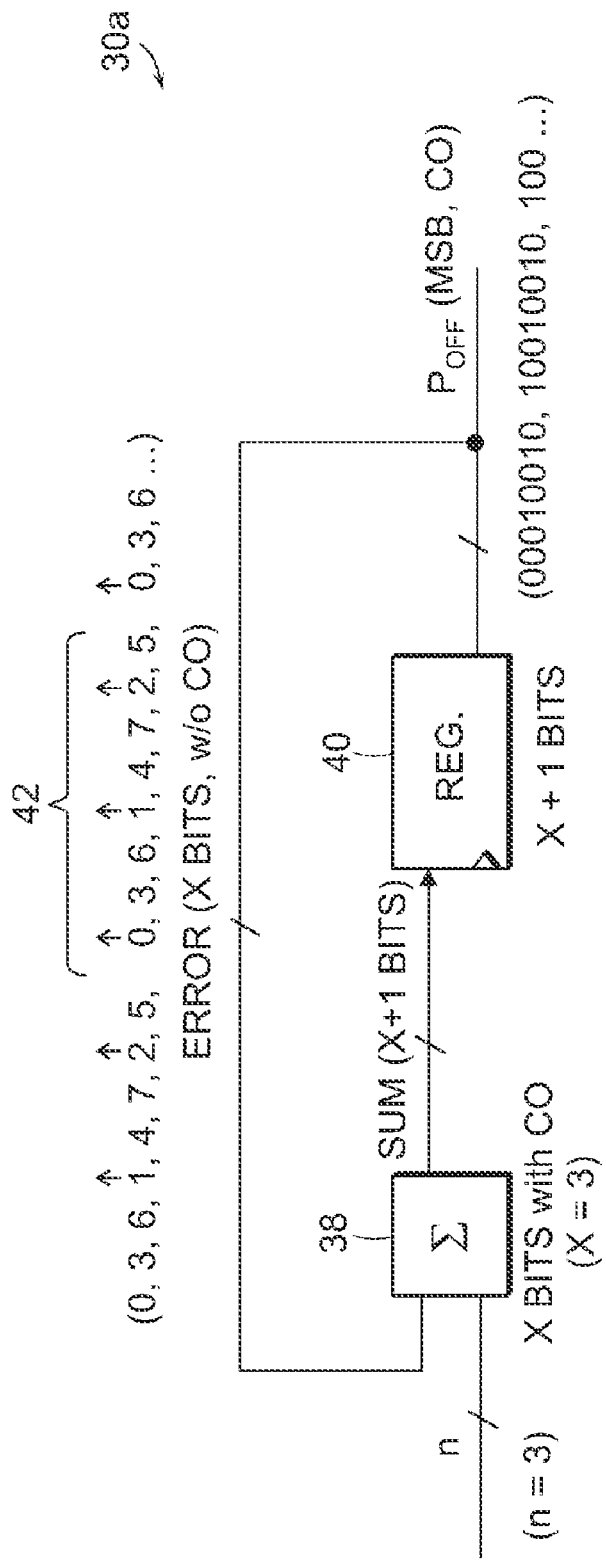
FIG. 3 is a block diagram of the fractional-N pattern generator of FIG. 2, according to one implementation where the numerator n is selectable, yet the denominator d is fixed, and $d=2^X$, where X is the width of the adder.

Modulator 30a in FIG. 3 illustrates one example of the modulator 30 of FIG. 2. Modulator 30 is less than optimal, with improvements addressed herein. The input is numerator n, and the output is fractional-N control signal $P_{OFF}$. Denominator d is not presented at input. In fact, d is fixed by the structure, which will be seen in the following explanation. Modulator 30a includes an adder circuit 38 and a register 40. Adder 38 can be formed by cascading one half adder for the least significant bit (LSB) and full adders for other bits. A half adder adds two binary bits A and B and generates a sum S and carry out (CO). A full adder adds carry in (CI) and two binary bits A and B and generates a sum S and a carry out (CO). They can be built by simple logic elements, for example NAND, NOR and NXOR gates. Register 40 can be built mainly by latches.

The value in the register is the $P_{OFF}$ at the most significant bit (MSB) and the error at the less significant bits (LSBs). If, for example, n=3, the adder is 3-bit wide (X=3) with a carry out, and the register is 4-bit wide, then beginning with register reset to 0, an registered error sequence of 0, 3, 6, 1, 4, 7, 2, 5, 0, 3, 6, 1, 4, 7, 2, 5, 0, 3, 6 . . . can occur from the LSBs. The carry out sequence produced from the MSB conductor is 00010010 10010010 100 . . . Thus, for the string of error values 42, an upward arrow indicates a carry out bit of logic 1 to produce the $P_{OFF}$ binary string. As shown, the pattern 42 is repeated as well as the corresponding carry out or $P_{OFF}$ string from the second clock cycle, where the first clock cycle is affected by reset.

Because the denominator is fixed at $2^X$ and is not an arbitrary integer and is not programmable, the resolution of fraction in modulator 30a is restricted. This problem can be overcome by a more preferred architecture set forth in FIG. 4.

Figure 4:
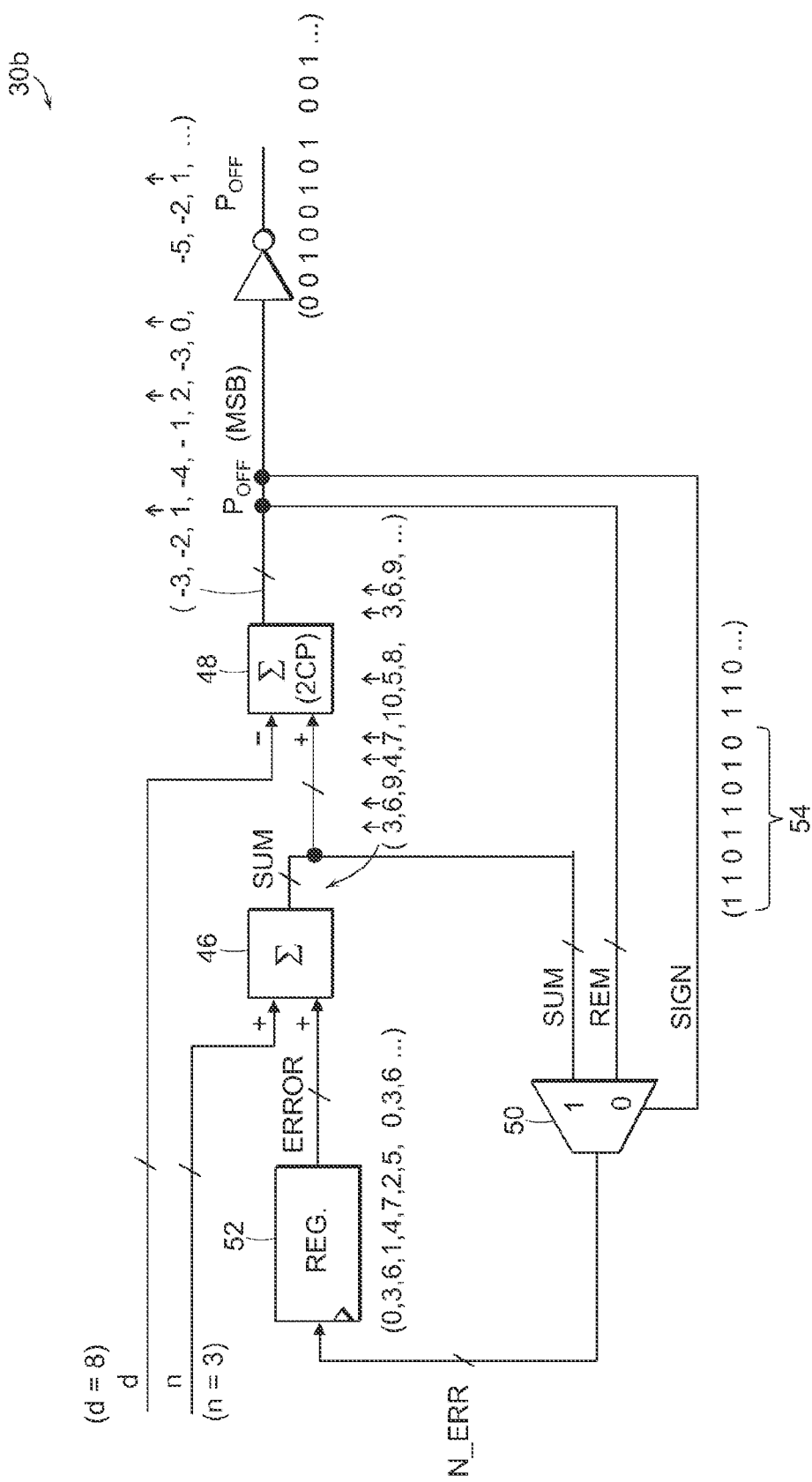
FIG. 4 is a block diagram of the fractional-N pattern generator of FIG. 2, according to a preferred embodiment where both the numerator and denominator are selectable, and the two possible errors of both delta directions are calculated by two adders in serial.

Turning to FIG. 4, a modulator circuit 30b is illustrated having at least one adder, and preferably two adders 46 and 48, who will generate two possible future errors of both delta direction. Adder 48 can be formed by inverting all of the bits of the value being subtracted (i.e., the denominator value) and set the least significant bit (LSB) carry in to be binary 1. The full adder operates as a subtractor in two's complement technique subtraction.

The output from the two's complement subtractor (full adder with inverted input and a LSBs carry in) circuit 48 produces a remainder value. The most significant bit (MSB) output from subtractor 48 constitutes a sign value. The sign value will decide the correct delta direction. If it is 0, then the future error from adder 48 (remainder) is selected by multiplexer 50; otherwise the future error from adder 46 (sum) is selected. The selected future error is forwarded to the register to update error at each proper clock edge. The correct delta direction also forms a delta-sigma modulated control signal $P_{OFF}$.

Shown merely as an example, a string of values can occur beginning with a 0 value output from register 52, with numerator n=3 and denominator d=8. At this ratio, error value output from register 52 will be incremented by 3 for each value in the sequence. The error value from adder 46 is subtracted from the denominator value to produce a remainder value. Whenever the remainder value is a negative number (i.e., denominator is greater than the possible future error value from adder 46), then the sign value will be represented as a logic 1 value. This is due to the nomenclature in which a signed two's complement binary number is represented. Essentially, a negative number in two's complement nomenclature encounters a logic 1 value in the most significant bit position. A positive number encounters a logic 0 value in the most significant bit position. Thus, all negative signed numbers will produce a logic 1 value in the most significant bit, output as a sign value.

The inputs to the sequential circuits of modulator 30b can comprise a clock signal along with the numerator and denominator values. The output signal $P_{OFF}$ is an inverted 1-bit feedback divider offset value in this example, which forms a first order delta-sigma pattern to modulate the PLL frequency. Modulator 30b operates in a first step to store the current error value. In the second step, possible future errors of both delta directions can be calculated. One future error is the sum, which is equal to the current error plus n. Another future error is the remainder, which equals sum minus d. In the third step, the correct delta direction is determined using the most significant bit (MSB) of the remainder value. This bit drives the output $P_{OFF}$ and the select input of the multiplexer 50. In the fourth step, the selected future error replaces the current error in register 52 at a new clock cycle. These steps repeat and the output forms a first order delta-sigma modulated fractional-N control signal forwarded to the feedback divider controller of the frequency synthesizer.

Since the logic core accepts arbitrary denominator d values directly, and generates delta-sigma modulated fractional-N control pattern, thus overcomes the inflexibility and low resolution problem created by modulator 30a (FIG. 3).

In the improved circuit, future errors are arithmetic operation results of current error and two input integers. The integers representing the fraction are in the form of numerator and denominator in modulator 30b, but they can be other arithmetic operation results of numerator, denominator and other quantities if the fraction information is correctly represented. This is illustrated in the following two embodiments 30c and 30d.

Figure 5:
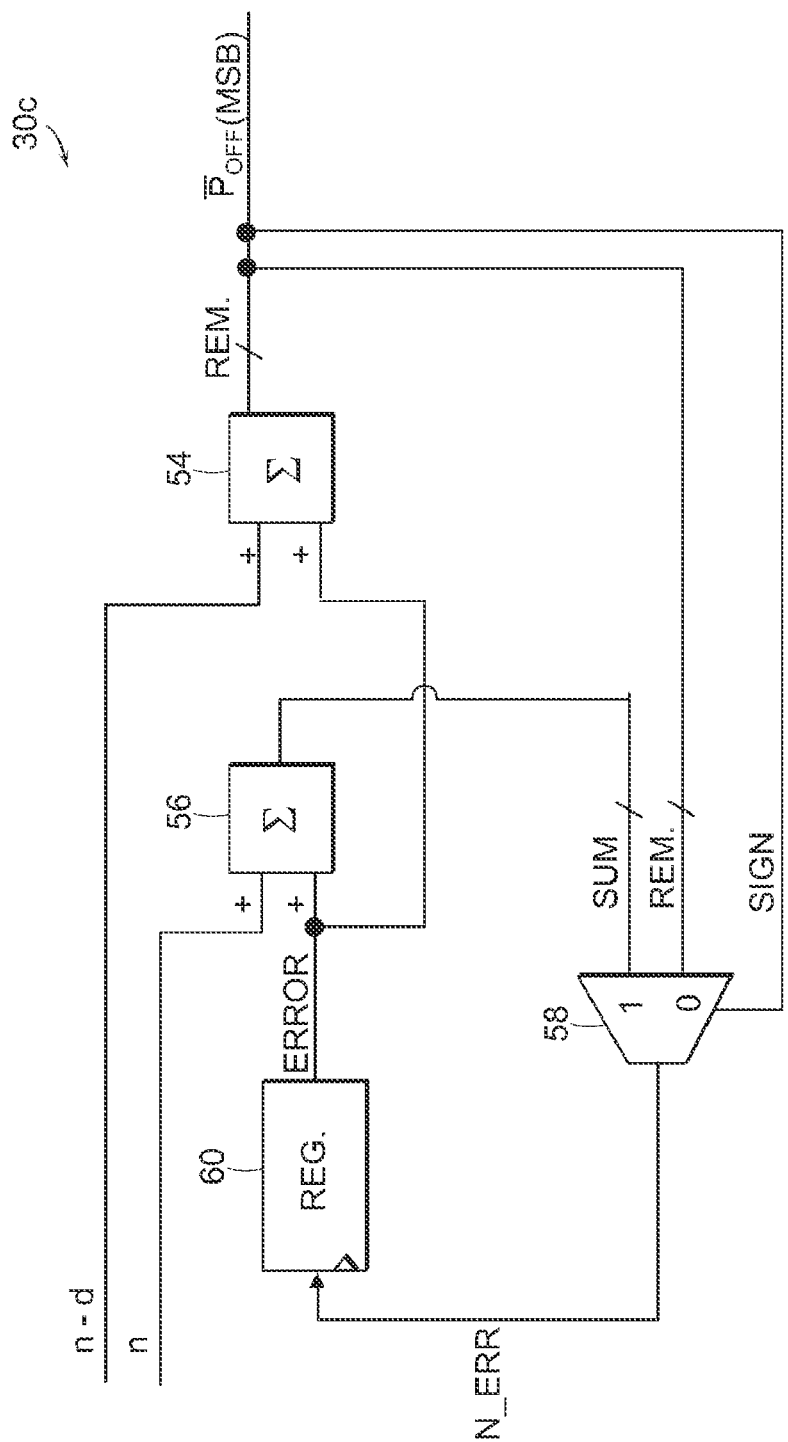
FIG. 5 is a block diagram of the fractional-N pattern generator of FIG. 2, according to another preferred embodiment using two adders in parallel to calculate two possible errors of both delta direction.

For example, the remainder calculation in FIG. 4 can be expedited by combining the two step sum plus n minus d calculation into one step by receiving precalculated "n−d". As illustrated in FIG. 5, the new modulator circuit 30c performs substantially the same function as modulator 30b, except that an improvement in speed of operation can occur using the parallel configuration.

Figure 6:
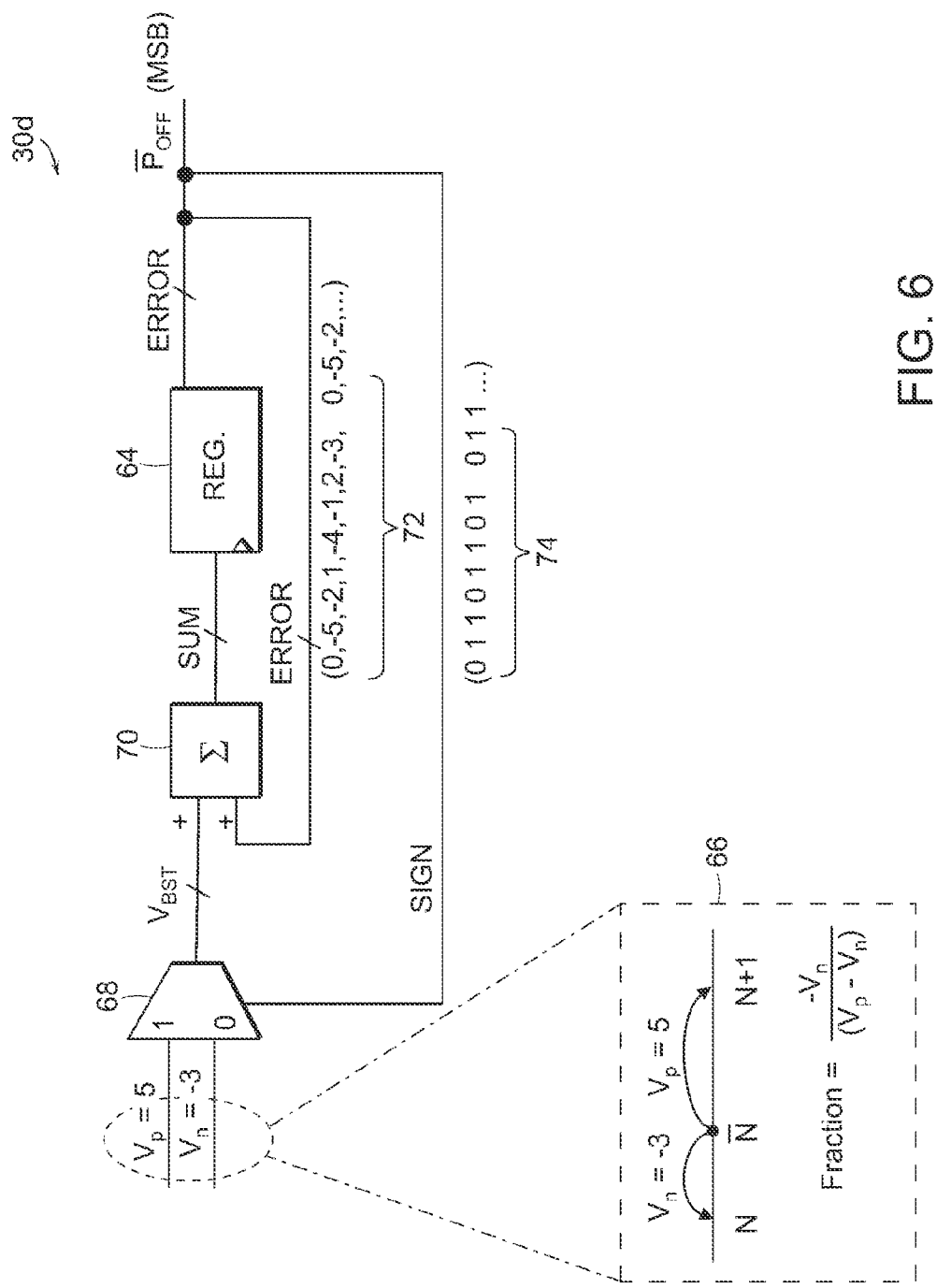
FIG. 6 is a block diagram of the fractional-N pattern generator of FIG. 2, according to yet another preferred embodiment receiving two vectors $V_p$ and $V_n$ as input, and using only one adder to calculate future error.

FIG. 6 illustrates another modulator 30d. It is different from 30b and 30c in many aspects, including the two input integer numbers (being vectors in 30d), the definition of the error and the number of adders in the architecture. In the new modulator, the input integers are two vectors, named positive vector $V_p$ and negative vector $V_n$. The error stored in the register is relative to other reference. One big advantage of this error is that it indicates the correct delta direction, so the future error of the wrong delta direction is not necessary to be calculated, and only one adder is needed. It improves speed and reduces circuit size. The way that the two vectors define the fraction n/d is illustrated at reference numeral 66 in FIG. 6, with the positive vector $V_p$=+5 and the negative vector $V_n$=−3, and the fraction n/d=−$V_n/(V_p-V_n)$=3/8. When the circuit runs, the register (current error) starts with a reset value, for example, O. The sign bit of the current error indicates the correct delta direction, and also forms the modulated signal $P_{OFF}$ (inverted). It instructs multiplexer 68 to select the appropriate positive or negative vector, and applies the "best" vector $V_{BST}$ to adder 70 as shown. The resulting sum value caused by adding the error value to the best vector is the future error of the correct delta direction. It will update register 64 at each clock cycle. For example, if the $V_p$=+5 and $V_n$=−3, then an error sequence (numeral 72) of 0, −5, −2, 1, −4, −1, 2, −3, ... and $P_{OFF}$ sequence (numeral 74) 1, 0, 0, 1, 0, 0, 1, 0, ... will be produced with period of d.

The vector values can be positive or negative, and when in case the fraction n/d is between 0 and 1 they are one positive and one negative, but they can be of other sign combinations if the fraction is in other ranges.

In addition to higher speed and less die area, another advantage of the embodiment of FIG. 6 is higher resolution. Since the vector sign bits are not necessary at the input buses, and the denominator $V_p-V_n$ is one bit wider than the input buses. This will result in a half-bit more resolution than the previous modulators 30b and 30c for the same input bus width.

Modulators and divider controllers in the embodiments above may be directly used in a frequency synthesizer to achieve non-integer N frequency synthesis. It is also useful in other applications where such modulated pattern is needed. Furthermore, the improved circuit and method may be used in applications such as spread spectrum modulation, communication signal encryption, or other applications that track digital signals. This is done by modulating one or more digital signals into one or more signals in the fractional-N control logic circuit architecture of modulator 30. In one embodiment, a digital signal may be added to the error. This improved method of using the fractional-N logic circuit to track digital values can also be extended to other fractional-N logic circuitry.

Modulators in the embodiments above can also be extended to high order delta-sigma logic by adding more stages, add appropriate feedback and feedforward between stages, and (or) cascading the stages with possibly a digital decimation filter therebetween to remove the oversampling noise of the delta-sigma modulator. To improve the speed, pipelines may be added in many of the modulator architectures in many places, for example in the adder and between stages of high order architecture.

The various circuit features set forth in the present disclosure are not to be interpreted as reflecting all possible features of the claimed invention. The specification and drawings are, therefore, to be regarded in an illustrative rather than a restrictive sense.

What is claimed is:

1. A modulator circuit, comprising:
   at least one adder coupled to produce a sum value, a remainder value and a sign value;
   a multiplexer coupled to forward the sum value or the remainder value to the at least one adder depending on the sign value; and
   wherein the at least one adder comprises a multi-bit output from which the remainder value is produced, and wherein the most significant bit output of the multi-bit output is coupled to produce the sign bit.

2. The modulator circuit as recited in claim 1, wherein the at least one adder comprises an input port for receiving a numerator value and a numerator value minus a denominator value.

3. The modulator circuit as recited in claim 1, wherein the at least one adder comprises an input port for receiving a numerator value and a denominator value.

4. The modulator circuit as recited in claim 3, wherein each time the sum value or the remainder value is forwarded to the at least one adder the sign value is updated to produce a binary bit pattern that repeats.

5. The modulator circuit as recited in claim 4, wherein the denominator value sets the number of bits within the binary bit pattern, and wherein the numerator value sets the number of bits within the binary bit pattern that are of a particular logic voltage.

6. The modulator circuit as recited in claim 1, wherein the at least one adder comprises a first adder and a second adder coupled in series, and wherein the second adder comprises a set of inverters and a carry input for performing two's complement subtraction.

7. The modulator circuit as recited in claim 6, wherein the first adder is coupled to receive a numerator value, and wherein the second adder is coupled to receive an output from the first adder as well as a denominator value and produces the sign value in a most significant bit position output from the second adder.

8. The modulator circuit as recited in claim 1, wherein the sign value is dependent on the output from the at least one adder comprises a signed binary number.

9. A circuit for producing a signal of selectable frequency, comprising:
   a phase-locked loop having a divider that fractionally divides a frequency of the signal corresponding to a ratio of a numerator value and a denominator value; and
   a first adder coupled to receive the numerator value and a second adder coupled to receive an output from the first adder as well as the denominator value for producing a sign value in the most significant bit position output from the second adder that repeats to form a repeating binary bit pattern sent to the fractional divider for selecting the frequency of the signal based on the number of bits within the binary bit pattern and the number of bits within the binary bit pattern that are of a particular logic voltage.

10. The circuit as recited in claim 9, wherein the denominator value sets the number of bits within the binary bit pattern and the numerator value sets the number of bits within the binary bit pattern that are of a particular logic voltage.

11. The circuit as recited in claim 9, further comprising an oscillator coupled to produce a signal of substantially fixed frequency to the phase-locked loop.

12. The circuit as recited in claim 9, wherein either the numerator value or the denominator value can be any integer number as long as the numerator value is less than the denominator value.

13. The circuit as recited in claim 9, wherein the divider divides the frequency of the signal by a first value (N) followed by a second value (N+1) offset by one from the first value.

14. The circuit as recited in claim 9, wherein the divider divides the frequency of the signal by a first value (N) followed by a second value (N+m) offset by m from the first value, wherein m is an integer greater than 1.

15. The circuit as recited in claim 9, wherein the modulator comprises a delta sigma modulator.

16. A method of modifying a frequency of a signal, comprising:
   modulating a bit pattern from a sequence of signed binary numbers by extracting the signed binary numbers from a digital word and extracting the bit pattern from the most significant bit output of the digital word;
   defining a ratio of the number bit that are of one particular logic value within the bit pattern over the bit pattern length by changing a numerator value relative to a denominator value; and
   dividing the frequency of the signal based on the defined ratio.

17. The method as recited in claim 16, wherein said modulating comprises setting a number of bits of the same logic value within the bit pattern equal to the numerator value.

18. The method as recited in claim 16, wherein said modulating comprises repeating the bit pattern at periodic interval, and wherein said modulating comprises setting the length of the bit pattern between intervals equal to the denominator value.

19. The method as recited in claim 16, wherein said modulating comprises setting a ratio of the number of bits that are of one particular logic value within the bit pattern over the bit pattern length proportional to the ratio of the numerator value divided by the denominator value.

* * * * *